(12) United States Patent
Kim et al.

(10) Patent No.: US 12,424,530 B2
(45) Date of Patent: Sep. 23, 2025

(54) SEMICONDUCTOR PACKAGE AND MANUFACTURING METHOD THEREOF

(71) Applicant: Samsung Electronics Co., Ltd., Suwon-si (KR)

(72) Inventors: Byung Wook Kim, Suwon-si (KR); A-Young Kim, Yongin-si (KR); Seong Won Jeong, Seoul (KR); Sang Su Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 17/853,116

(22) Filed: Jun. 29, 2022

(65) Prior Publication Data

US 2023/0067356 A1  Mar. 2, 2023

(30) Foreign Application Priority Data

Aug. 27, 2021 (KR) .......................... 10-2021-0113607

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4846* (2013.01); *H01L 23/49838* (2013.01); *H01L 23/49894* (2013.01); *H01L 24/11* (2013.01); *H01L 24/16* (2013.01); *H01L 24/32* (2013.01); *H01L 24/73* (2013.01); *H01L 2224/10156* (2013.01); *H01L 2224/11013* (2013.01);
(Continued)

(58) Field of Classification Search
CPC ........ H01L 23/49816; H01L 23/49838; H01L 2224/10156; H01L 2224/73204; H01L 2224/16225; H01L 2224/32225; H01L 2224/81801; H01L 2924/00012; H01L 2924/15311; H01L 2924/00014; H01L 2924/10156
See application file for complete search history.

(56) References Cited

U.S. PATENT DOCUMENTS 6,569,755 B2   5/2003   Yamada et al.
8,283,781 B2   10/2012  Wu et al.
(Continued)

FOREIGN PATENT DOCUMENTS

CN   102088012 A   6/2011
CN   107564878 A   1/2018
JP   2012004436 A  1/2012

*Primary Examiner* — Joshua Benitez Rosario
*Assistant Examiner* — Jacob T Nelson
(74) *Attorney, Agent, or Firm* — Harness, Dickey & Pierce, P.L.C.

(57) ABSTRACT

A semiconductor package capable of reducing or preventing cracks from occurring in a conductive bump and a method for manufacturing the same. The semiconductor package includes a semiconductor chip; a first conductive bump; a first re-distribution layer which is provided between the semiconductor chip and the first conductive bump and electrically connects the semiconductor chip and the first conductive bump; and a buffer structure which formed to fill up a space between a side surface of the first conductive bump and one surface of the first re-distribution layer, in which the buffer structure includes a plurality of pores.

11 Claims, 15 Drawing Sheets

(51) Int. Cl.
*H01L 23/00* (2006.01)
*H01L 23/48* (2006.01)

(52) U.S. Cl.
CPC ............ *H01L 2224/16227* (2013.01); *H01L 2224/16237* (2013.01); *H01L 2224/32225* (2013.01); *H01L 2224/73204* (2013.01); *H01L 2924/3511* (2013.01); *H01L 2924/3512* (2013.01)

(56) References Cited

U.S. PATENT DOCUMENTS

| | | |
|---|---|---|
| 8,778,792 B2 | 7/2014 | Daubenspeck et al. |
| 8,963,328 B2 | 2/2015 | Yang et al. |
| 9,362,204 B2 | 6/2016 | Woychik et al. |
| 9,426,899 B2 | 8/2016 | Kitae et al. |
| 10,840,199 B2 | 11/2020 | Chang et al. |
| 10,985,121 B2 | 4/2021 | Huang et al. |
| 2007/0176292 A1* | 8/2007 | Chen ........................ H01L 24/05 257/E23.021 |
| 2008/0081458 A1* | 4/2008 | Lin .......................... H01L 24/05 438/620 |
| 2018/0286793 A1* | 10/2018 | Cheng ................... H01L 25/105 |

* cited by examiner

[FIG. 1]
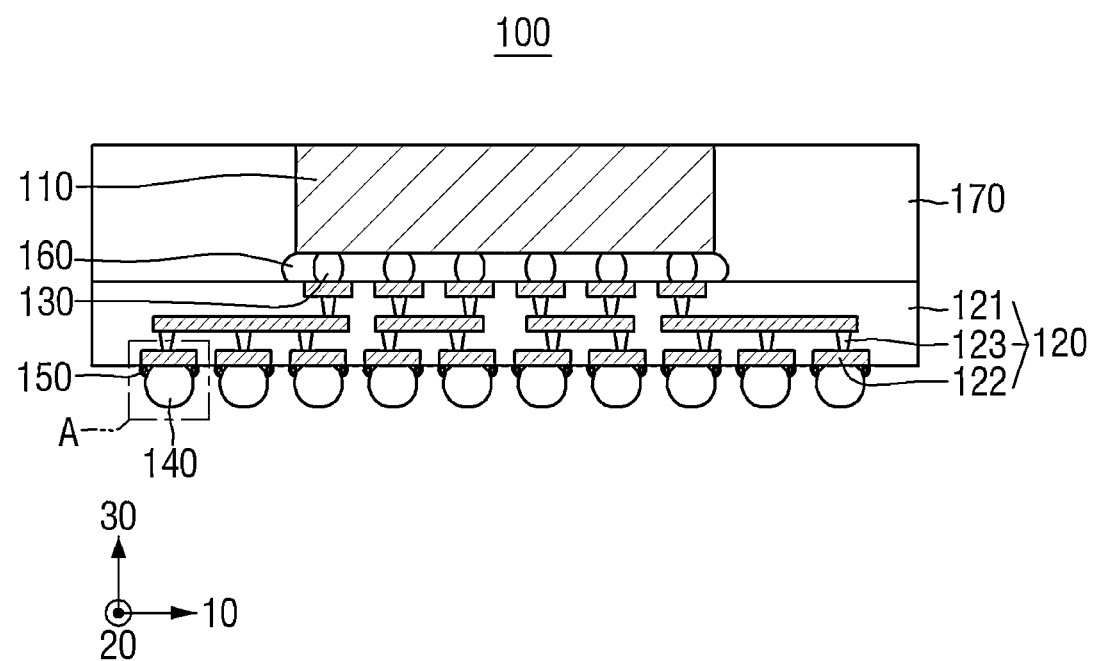

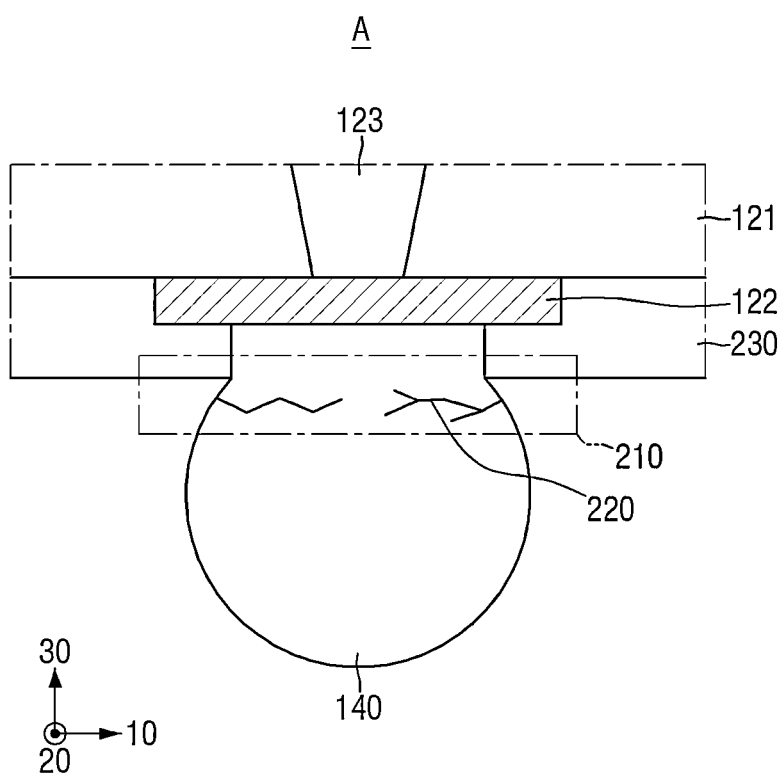

[FIG. 3]
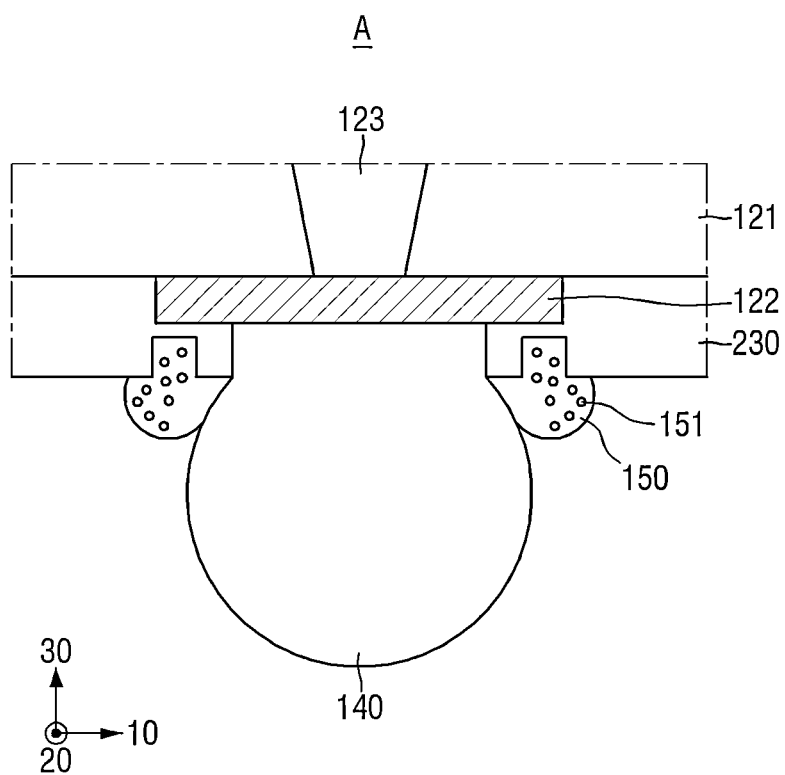

[FIG. 4]
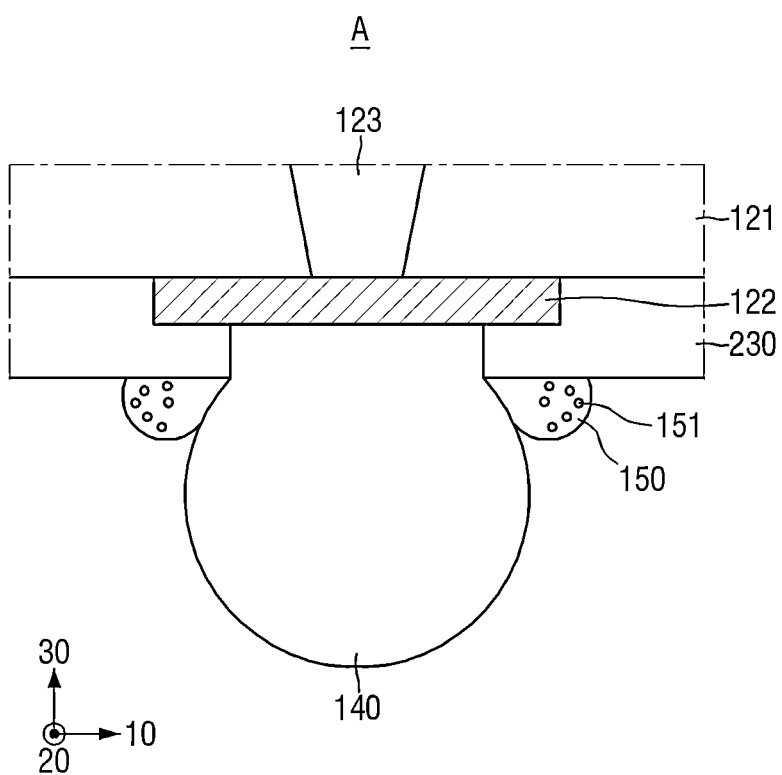

[FIG. 5]
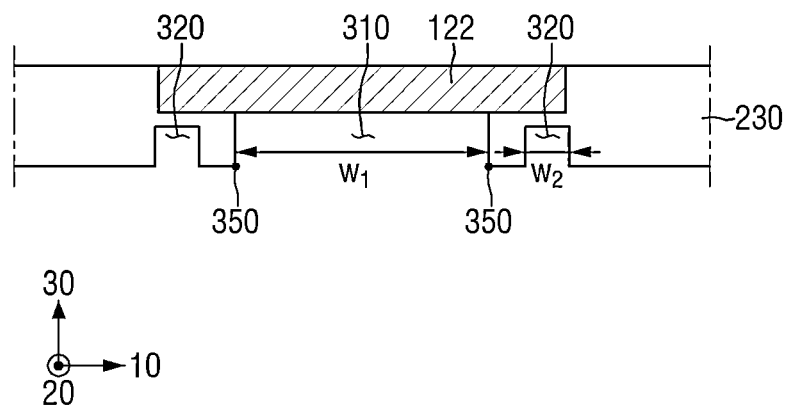

[FIG. 6]
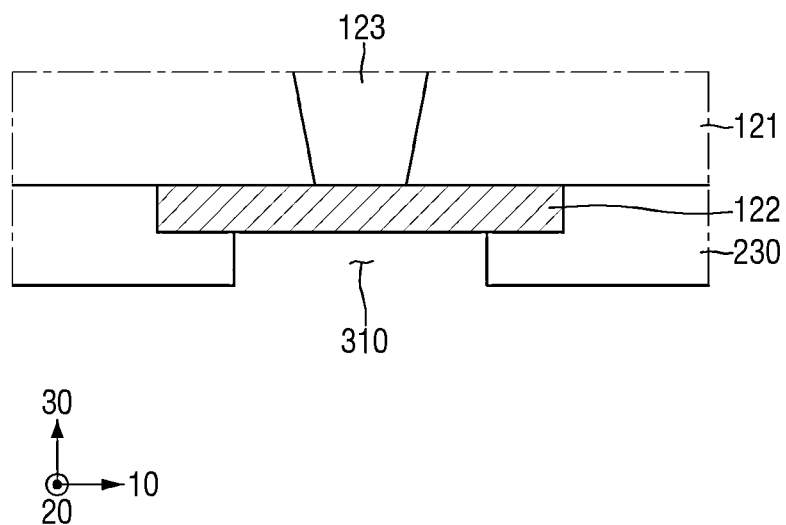

[FIG. 7]
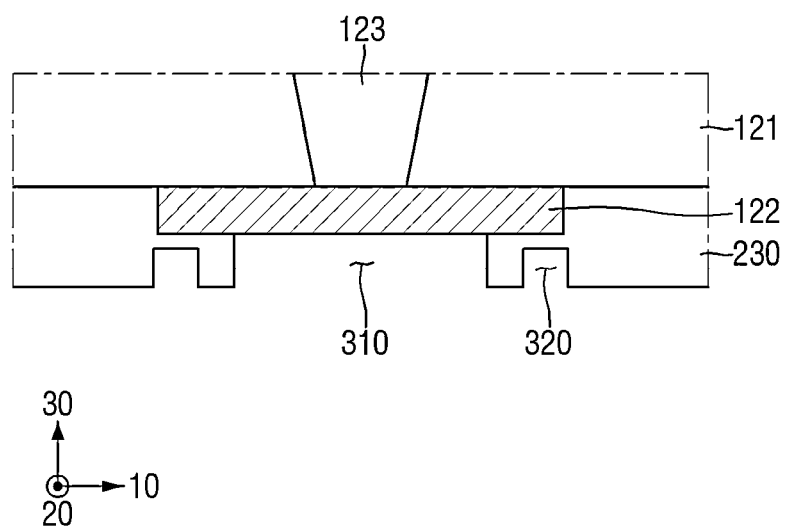

[FIG. 8]
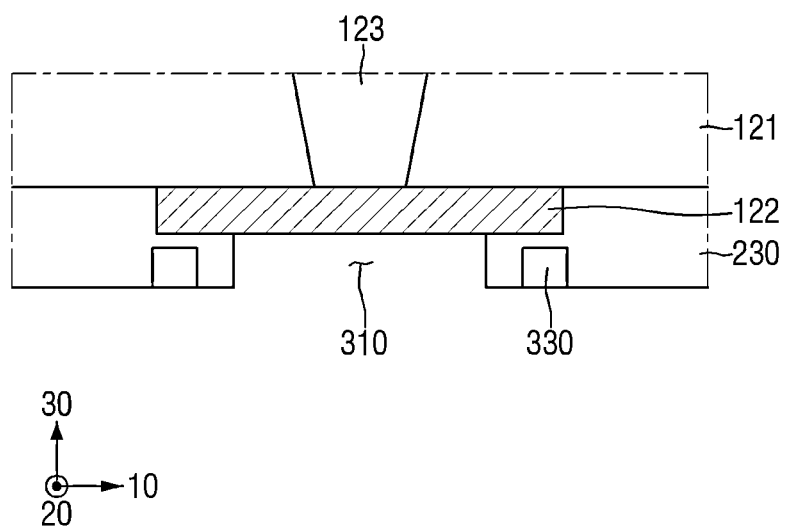

[FIG. 9]
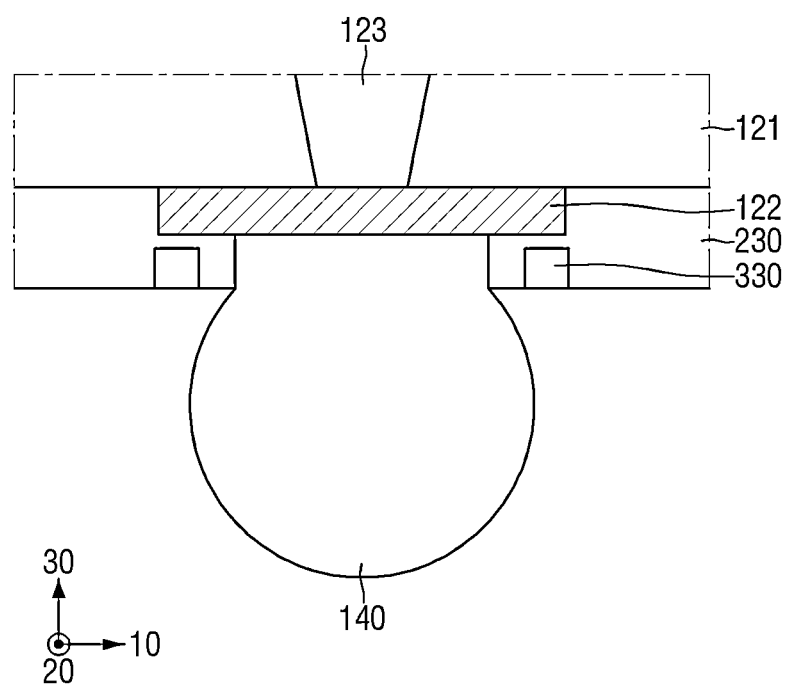

[FIG. 10]
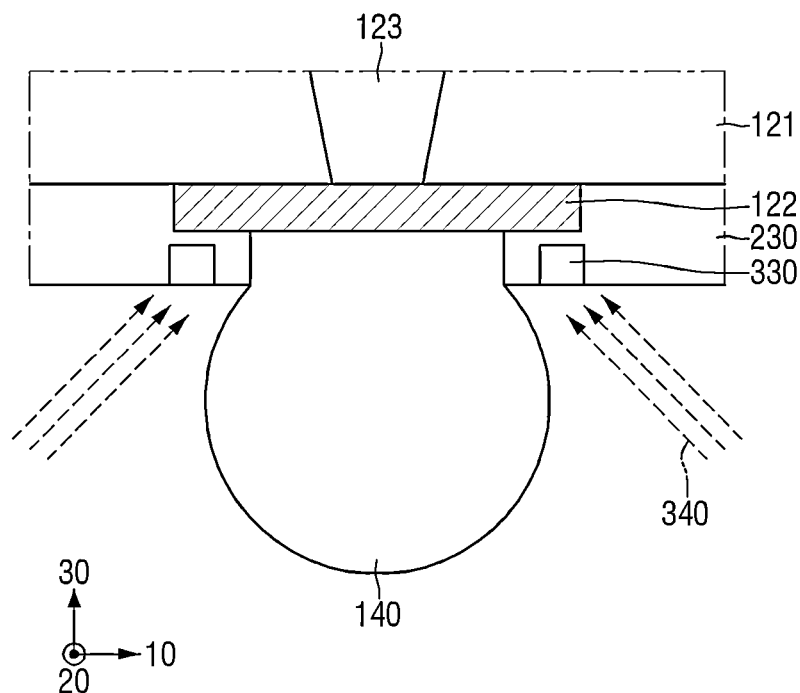

[FIG. 11]
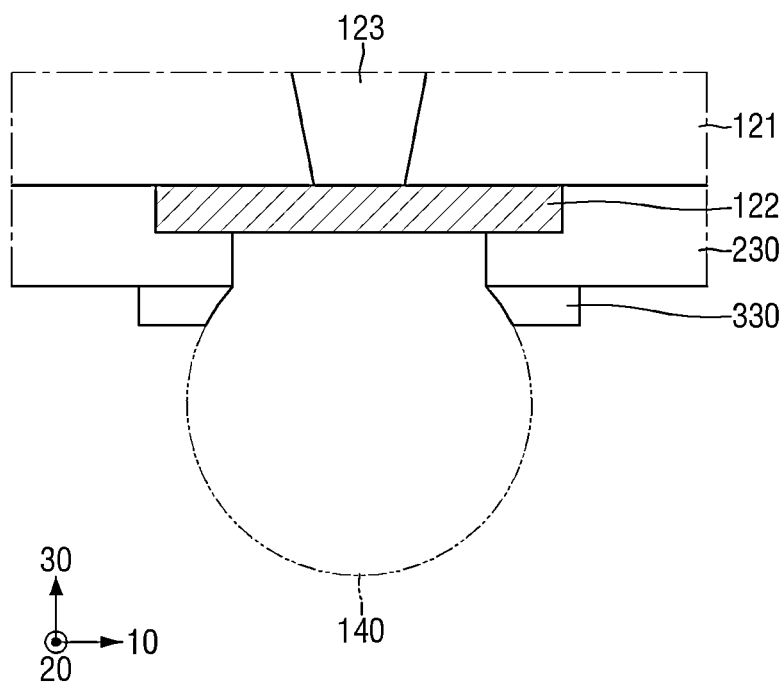

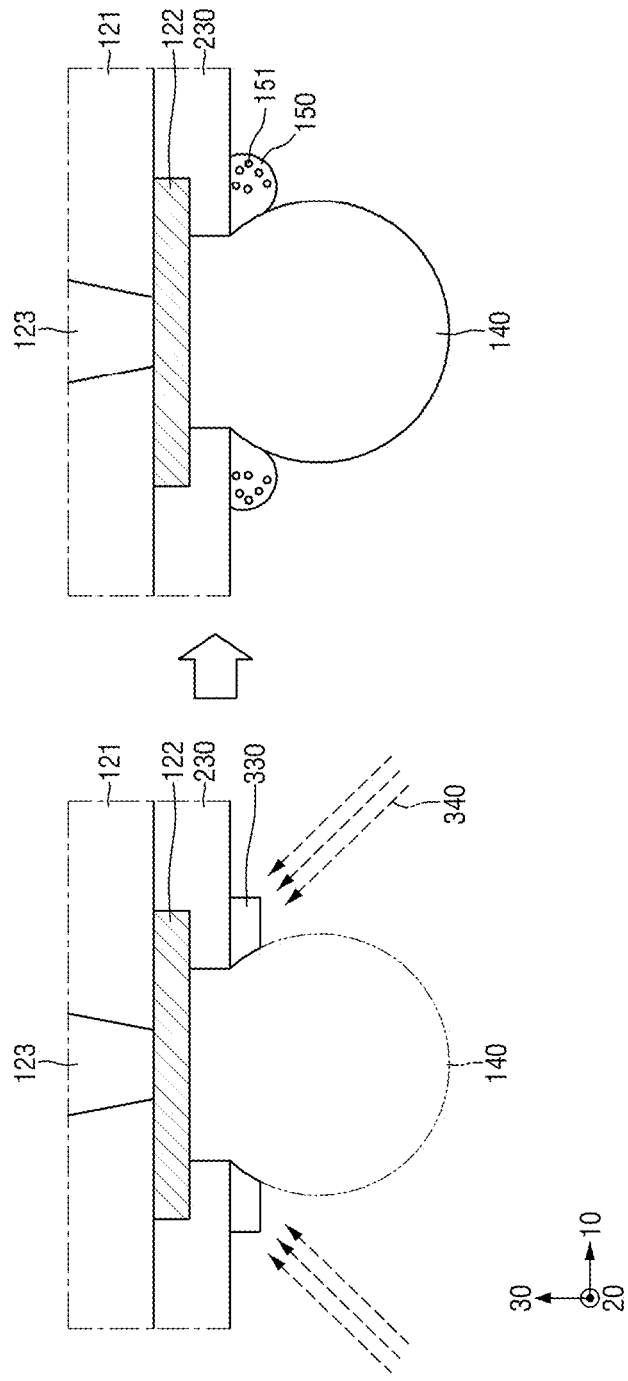
[FIG. 12]

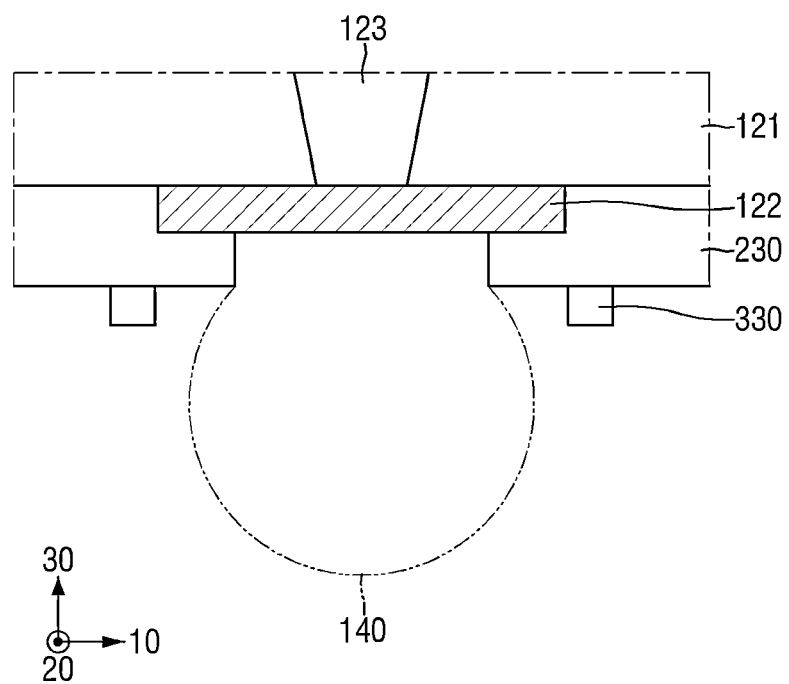
[FIG. 13]

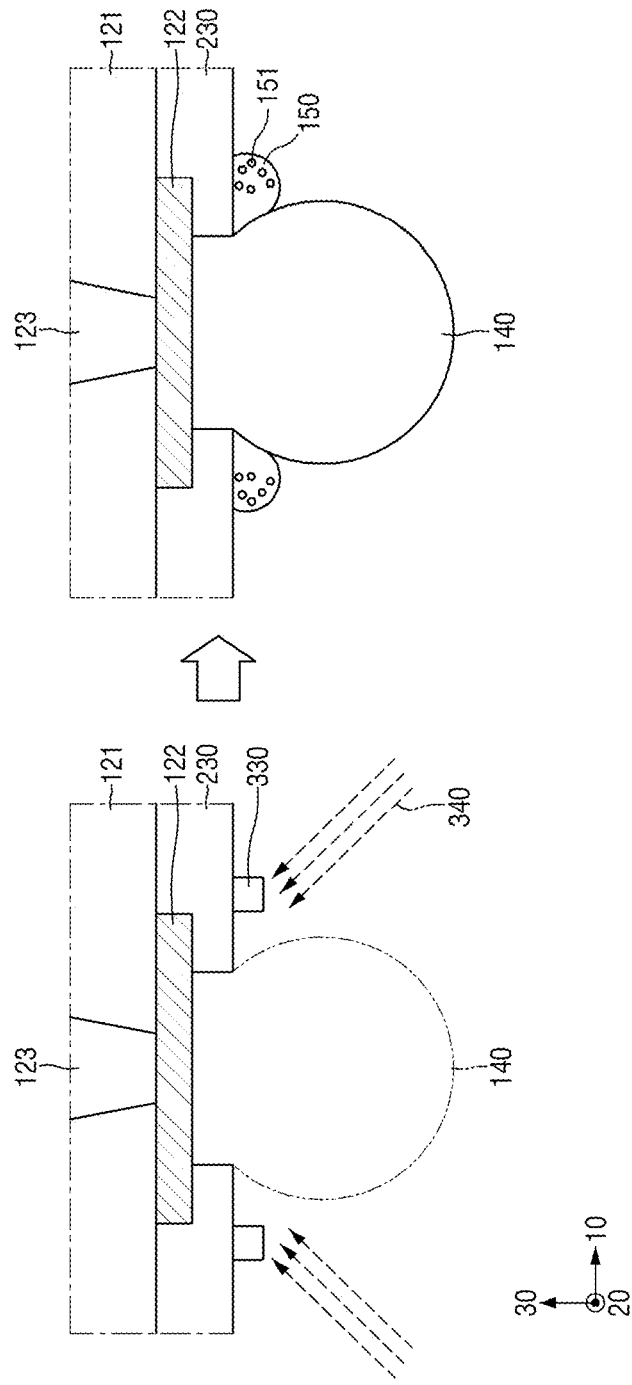
[FIG. 14]

[FIG. 15]
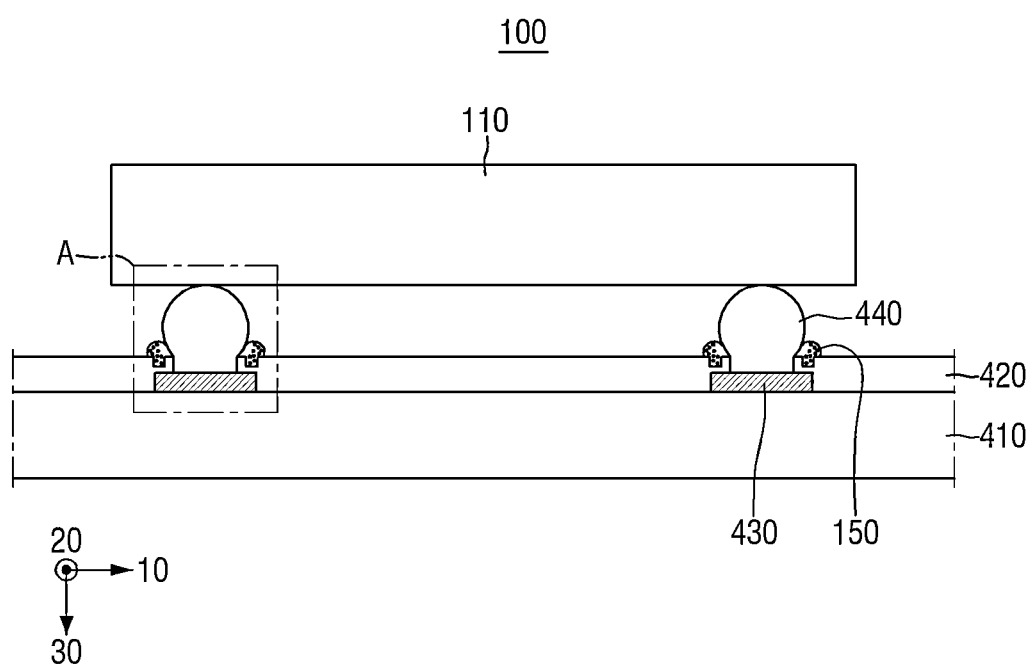

SEMICONDUCTOR PACKAGE AND MANUFACTURING METHOD THEREOF

CROSS-REFERENCE TO RELATED APPLICATION

This application claims priority from Korean Patent Application No. 10-2021-0113607 filed on Aug. 27, 2021 in the Korean Intellectual Property Office and all the benefits accruing therefrom under 35 U.S.C. 119, the contents of which in its entirety are herein incorporated by reference.

BACKGROUND

1. Field

The present disclosure relates to a semiconductor package and a method for manufacturing the same. More specifically, the present disclosure relates to a semiconductor package including a conductive bump such as a solder ball and a method for manufacturing the same.

2. Description of the Related Art

The semiconductor chip may be mounted on a circuit board, using a surface mounting technology (SMT). In this case, the solder ball may be used to connect a semiconductor chip and a circuit board so that an electrical signal may be transmitted between them.

Incidentally, during a process of manufacturing a semiconductor package, a warpage phenomenon may occur on the circuit board due to a mismatch in a coefficient of thermal expansion (CTE) between the semiconductor chip and the circuit board, which may cause cracks in the solder ball.

Further, a mechanical stress may occur on the circuit board due to the difference in physical properties between the semiconductor chip and the circuit board, which may cause cracks in the solder ball.

SUMMARY

Aspects of the present disclosure provide a semiconductor package capable of reducing or preventing cracks from occurring in a conductive bump such as a solder ball, and a method for manufacturing the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an example embodiment of the present disclosure, there is provided a semiconductor package, comprising a semiconductor chip, a first conductive bump, a first re-distribution layer which is provided between the semiconductor chip and the first conductive bump and electrically connects the semiconductor chip and the first conductive bump, and a buffer structure which fills a space between a side surface of the first conductive bump and one surface of the first re-distribution layer, wherein the buffer structure includes a plurality of pores.

According to another example embodiment of the present disclosure, there is provided a semiconductor package, comprising a semiconductor chip, a first conductive bump, a first re-distribution layer which is provided between the semiconductor chip and the first conductive bump and electrically connects the semiconductor chip and the first conductive bump, and a buffer structure which fills a space between a side surface of the first conductive bump and one surface of the first re-distribution layer, wherein the buffer structure includes a plurality of pores, is formed using a polymer including a chemical foaming agent (CFA), and is formed by irradiating a beam of a UV wavelength band in a direction in which the polymer is located.

According to another example embodiment of the present disclosure, there is provided a semiconductor package, comprising a method for manufacturing a semiconductor package, the method comprising a step of providing a first re-distribution layer which electrically connects a semiconductor chip and a first conductive bump, and to which a first wiring located at highest or lowest level is exposed, a step of placing a polymer on the first re-distribution layer or inside the first re-distribution layer, a step of connecting the first conductive bump to the first wiring, and a step of irradiating a beam in a direction in which the polymer is located to form the polymer into a buffer structure including a plurality of pores, wherein the buffer structure fills a space between a side surface of the first conductive bump and one surface of the first re-distribution layer.

The objects of the present disclosure are not limited to those mentioned above and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail example embodiments thereof referring to the attached drawings, in which:

FIG. 1 is a cross-sectional view schematically showing a structure of a semiconductor package according to a first embodiment of the present disclosure.

FIG. 2 is an example diagram for explaining the background of formation of the buffer structure constituting the semiconductor package according to the first embodiment of the present disclosure.

FIG. 3 is an example diagram which shows the structure of the buffer structure constituting the semiconductor package according to the first embodiment of the present disclosure in an enlarged manner.

FIG. 4 is an enlarged view which shows the structure of the buffer structure which constitutes a semiconductor package according to a second embodiment of present disclosure.

FIG. 5 is explanatory drawing for explaining the trench area of the buffer structure constituting the semiconductor package according to the first embodiment of present disclosure.

FIG. 6 is a first example diagram for explaining the method for manufacturing the buffer structure constituting the semiconductor package according to the first embodiment of present disclosure.

FIG. 7 is a second example diagram for explaining a method for manufacturing a buffer structure constituting a semiconductor package according to the first embodiment of the present disclosure.

FIG. 8 is a third example diagram for explaining the method for manufacturing the buffer structure constituting the semiconductor package according to the first embodiment of present disclosure.

FIG. 9 is a fourth example diagram for explaining a method for manufacturing a buffer structure constituting a semiconductor package according to the first embodiment of the present disclosure.

FIG. 10 is a fifth example diagram for explaining a method for manufacturing a buffer structure constituting the semiconductor package according to the first embodiment of the present disclosure.

FIG. 11 is a first example diagram for explaining a method for manufacturing a buffer structure constituting a semiconductor package according to a second embodiment of the present disclosure.

FIG. 12 is a second example diagram for explaining a method for manufacturing a buffer structure constituting a semiconductor package according to a second embodiment of the present disclosure.

FIG. 13 is a third example diagram for explaining a method for manufacturing the buffer structure constituting the semiconductor package according to the second embodiment of the present disclosure.

FIG. 14 is a fourth example diagram for explaining the method for manufacturing the buffer structure constituting the semiconductor package according to the second embodiment of the present disclosure.

FIG. 15 is a cross-sectional view schematically showing the structure of a semiconductor package according to a third embodiment of the present disclosure.

DETAILED DESCRIPTION OF THE EMBODIMENTS

Hereinafter, embodiments of the present disclosure will be described in detail referring to the accompanying drawings. The same constituent elements on the drawings are denoted by the same reference numerals, and repeated descriptions thereof will be omitted.

The present disclosure relates to a semiconductor package capable of reducing or preventing cracks from occurring in the conductive bump such as a solder ball, and a method for manufacturing the same. Hereinafter, the present disclosure will be described in detail referring to the drawings and the like.

FIG. 1 is a cross-sectional view schematically showing a structure of a semiconductor package according to a first embodiment of the present disclosure.

According to FIG. 1, the semiconductor package 100 may be configured to include a semiconductor chip 110, a first re-distribution layer (1$^{st}$ RDL) 120, a second conductive bump 130, a first conductive bump 140, and a buffer structure 150.

The semiconductor package 100 including the semiconductor chip 110, is manufactured according to a packaging process, and may be used to electrically connect the semiconductor chip 110 to a circuit board (for example, a main board of an electronic device). The semiconductor package 100 may be provided, for example, as a package substrate such as a BGA (Ball Grid Array).

The semiconductor chip 110 may perform a calculation function, a control function, a storage function, and the like in an electronic device. The semiconductor chip 110 may be provided as, for example, a logic chip or a memory chip. When the semiconductor chip 110 is provided as a logic chip, it may be a central processing unit (CPU), a controller, an application specific integrated circuit (ASIC), or the like. When the semiconductor chip 110 is provided as a memory chip, it may be a volatile memory chip such as a DRAM (Dynamic Random Access Memory) or a SRAM (Static RAM), or a non-volatile memory chip such as a PRAM (Phase-change RAM), a MRAM (Magnetoresistive RAM), a FeRAM (Ferroelectric RAM) or a RRAM (Resistive RAM).

The first re-distribution layer (1$^{st}$ RDL) 120 electrically connects the semiconductor chip 110 and the first conductive bump 140. The first re-distribution layer 120 may include a first insulating film 121, a first wiring 122, and a via 123.

The first re-distribution layer 120 may further include a second insulating film 230. The second insulating film 230 will be described later herein.

The first insulating film 121 is formed between the semiconductor chip 110 and the first conductive bump 140, using an insulating substance (for example, polyimide) as a material. Such a first insulating film 121 may be formed by at least one layer, and may be formed by being stacked when formed by a plurality of layers. The first insulating film 121 may include a photosensitive insulating substance (e.g., PID (Photo Imageable Dielectric)).

The first wiring 122 electrically connects the semiconductor chip 110 and the first conductive bump 140. The first wiring 122 may be formed inside the first insulating film 121, and may be formed using an electrically conductive substance as a material. The first wiring 122 may be formed, for example, by combining at least one conductive metal selected from nickel (Ni), chromium (Cr), copper (Cu), gold (Au), silver (Ag), platinum (Pt), aluminum (Al), palladium (Pd), titanium (Ti), and the like.

The first wiring 122 may include a plurality of wirings formed at the same level. A plurality of wirings formed at the same level may be formed to be spaced apart from each other in a horizontal direction (a first direction 10 or a second direction 20). Further, the first wiring 122 may include a plurality of wirings formed at different levels from each other. The plurality of wirings formed at different levels from each other may be formed to be spaced apart from each other in a vertical direction (a third direction 30).

The via 123 electrically connects a plurality of wirings formed at different levels from each other. The via 123 may be formed inside the first insulating film 121 similarly to the first wiring 122, and may be formed of an electrically conductive substance as a material. The via 123 may be formed of the same material as the first wiring 122 as a material, but may be formed of different substances as a material as long as it is possible to electrically connect a plurality of wirings formed at different levels.

The second conductive bump 130 electrically connects the semiconductor chip 110 and the first wiring 122 of the first re-distribution layer 120. The second conductive bump 130 may be connected to a conductive terminal exposed to the bottom of the semiconductor chip 110 at one end portion, and may be connected to a top wiring exposed to the top of the first re-distribution layer 120 at the other end portion.

The second conductive bump 130 may be formed of an electrically conductive substance as a material. The second conductive bump 130 may be formed, for example, by combining at least one conductive metal selected from tin (Sn), indium (In), lead (Pb), zinc (Zn), nickel (Ni), gold (Au), silver (Ag), copper (Cu), antimony (Sb), bismuth (Bi), and the like. The second conductive bump 130 may be provided, for example, as a solder ball.

On the other hand, in the present embodiment, it is also possible to electrically connect the semiconductor chip 110 and the first wiring 122 of the first re-distribution layer 120, using wire bonding instead of the second conductive bump 130.

The first conductive bump 140 electrically connects the semiconductor package 100 including the semiconductor chip 110 to an external electronic device. The first conductive bump 140 may be connected to a lowest wiring exposed to the bottom of the first re-distribution layer 120 at one end portion. Although not shown in FIG. 1, the other end portion of the first conductive bump 140 may be connected to a circuit board provided in an external electronic device.

On the other hand, the first conductive bump 140 may be formed of an electrically conductive substance as a material similarly to the second conductive bump 130, and may be provided as a solder ball.

The buffer structure 150 mitigates or prevents cracks from occurring in the first conductive bump 140. FIG. 2 is an example diagram for explaining the background of formation of the buffer structure constituting the semiconductor package according to the first embodiment of the present disclosure, and FIG. 3 is an example diagram which shows the structure of the buffer structure constituting the semiconductor package according to the first embodiment of the present disclosure in an enlarged manner.

When the semiconductor package 100 is manufactured, a warpage phenomenon may occur in the first re-distribution layer 120 due to a mismatch in the coefficient of thermal expansion (CTE) between the semiconductor chip 110 and the first re-distribution layer 120. As a result, as shown in FIG. 2, a crack 220 may occur in a neck area 210 of the first conductive bump 140. Further, the crack 220 may occur in the neck area 210 of the first conductive bump 140 due to mechanical stress due to a difference in physical properties between the semiconductor chip 110 and the first re-distribution layer 120.

In the present embodiment, in order to mitigate or prevent the crack 220 from occurring in the neck area 210 of the first conductive bump 140, as shown in FIG. 3, a buffer structure 150 may be included outside the neck area 210 of the first conductive bump 140. Here, the buffer structure 150 may function as a stress buffer in an area in which a solder ball crack path is short.

The buffer structure 150 may be formed, using a polymer. Here, the polymer may include a chemical foaming agent (CFA).

The buffer structure 150 may include a plurality of pores 151 (or cavities). At this time, the proportion occupied by the pores 151 may be 30% to 70% of the total proportion of the buffer structure 150. The buffer structure 150 may be provided as a porous polymer structure, when formed using a polymer.

The plurality of pores 151 may be formed to have a uniform size inside the buffer structure 150. However, the present embodiment is not limited thereto. The plurality of pores 151 may be formed to have a non-uniform size inside the buffer structure 150, and some pores 151 among the plurality of pores 151 may be formed to have a uniform size, and some other pores 151 may also be formed to have a non-uniform size.

On the other hand, the pores 151 may have a size of 1% to 10% compared to the size of the first conductive bump 140. The size of the pores 151 may be adjusted on the basis of the time for irradiating the buffer structure 150 with a beam, the intensity of the beam, the concentration of the chemical foaming agent, and the like. That is, in the present embodiment, the plurality of pores 151 may be formed to have a uniform size on the basis of the irradiation time of a beam, the intensity of the beam, the concentration of the chemical foaming agent, and the like.

The buffer structure 150 may be formed to include a plurality of pores 151 using a beam of a specific frequency band. The buffer structure 150 may be formed, for example, to include a plurality of pores 151, by utilizing a beam of a UV (Ultra-Violet) wavelength band. In this embodiment, the buffer structure 150 may be provided as a porous polymer structure, for example, using an UV laser beam.

The buffer structure 150 includes a trench area formed on the second insulating film 230, and may be formed outside the neck area 210 of the first conductive bump 140. However, the present embodiment is not limited thereto. As shown in FIG. 4, the buffer structure 150 does not include the trench area and may be formed outside the neck area 210 of the first conductive bump 140. FIG. 4 is an enlarged view which shows the structure of the buffer structure which constitutes a semiconductor package according to a second embodiment of the present disclosure.

As shown in FIG. 5, the trench area 320 may be formed to be spaced apart by a predetermined distance from an end portion 240 of an area 310 into which the first conductive bump 140 is inserted to be electrically connected to the first wiring 122, that is, an SR open area 310. For example, the center of the trench area 320 may be within (Ball Diameter—SR Open Size)/4 from the end portion 350 of the SR open area 310. Here, the ball diameter means a diameter of the first conductive bump 140, and the SR open size means a width $w_1$ of the SR open area 310.

On the other hand, a width $w_2$ of the trench area 320 may have a size of 3% to 10% of the diameter of the first conductive bump 140. FIG. 5 is an explanatory drawing for explaining the trench area of the buffer structure constituting the semiconductor package according to the first embodiment of present disclosure.

Hereinafter, a case where the buffer structure 150 includes the trench area 320 and is formed outside of the neck area 210 of the first conductive bump 140, and a case where the buffer structure 150 does not include the trench area 320 and is formed outside the neck area 210 of the first conductive bump 140 will be sequentially described.

First, a case where the buffer structure 150 includes the trench area 320 and is formed outside the neck area 210 of the first conductive bump 140 will be described.

When the first wiring 122 exposed to the bottom of the first insulating film 121, that is, the lowest wiring is provided, the second insulating film 230 is formed in other areas except for the area 310 into which the first conductive bump 140 is inserted, as shown in FIG. 6.

The second insulating film 230 may be formed of the same insulating substance as the first insulating film 121. However, the present embodiment is not limited thereto. As long as the electric signal may be effectively blocked from flowing in the area, the second insulating film 230 may also be formed of an insulating substance different from that of the first insulating film 121 as a material. The second insulating film 230 may be provided, for example, with a solder resist. FIG. 6 is a first example diagram for explaining the method for manufacturing the buffer structure constituting the semiconductor package according to the first embodiment of present disclosure.

When the second insulating film 230 is formed to cover at least a part of the area of the first insulating film 121 and the first wiring 122 (that is, an area that does not come into contact with the first conductive bump 140), the trench area 320 is formed on the second insulating film 230.

The trench area 320 is an area into which polymer used to form the buffer structure 150 is inserted, and may be formed to have a depth at which the trench area 320 does not come into contact with the first wiring 122. That is, the depth of the trench area 320 may not be deeper than the depth of the insertion area 310 of the first conductive bump 140.

However, the present embodiment is not limited thereto. As long as the trench area 320 may not come into contact with the first wiring 122 regardless of the depth, the trench area 320 may be formed to have the same depth as the insertion area 310 of the first conductive bump 140, or may be formed to have a depth deeper than the insertion area 310 of the first conductive bump 140. FIG. 7 is a second example diagram for explaining a method for manufacturing a buffer structure constituting a semiconductor package according to the first embodiment of the present disclosure.

On the other hand, when the trench area 320 is formed to have a depth deeper than the insertion area 310 of the first conductive bump 140, the trench area 320 may be formed not only on the second insulating film 230 but also on the first insulating film 121.

When the trench area 320 is formed in the second insulating film 230, the polymer 330 fills the trench area 320 and therefore is on the second insulating film 230 defining sidewalls and base wall of the trench area 320 as shown in FIG. 8. The polymer 330 may include a chemical foaming agent (CFA) as described above. FIG. 8 is a third example diagram for explaining the method for manufacturing the buffer structure constituting the semiconductor package according to the first embodiment of the present disclosure.

When the polymer 330 is filled up in the trench area 320, the first conductive bump 140 is installed in the non-region 310 in which the second insulating film 230 is not formed as shown in FIG. 9 so that the first conductive bump 140 may come into contact with the first wiring 122. FIG. 9 is a fourth example diagram for explaining a method for manufacturing a buffer structure constituting a semiconductor package according to the first embodiment of the present disclosure.

When the first conductive bump 140 is installed to be in contact with the first wiring 122, a beam 340 of a specific wavelength band is irradiated in a direction in which the polymer 330 is located, as shown in FIG. 10. At this time, the irradiated beam 340 may be tilted by a predetermined angle with respect to a longitudinal direction (the first direction 10) of the first re-distribution layer 120. At this time, a tilting angle of the beam 340 may be 45 to 80 degrees on the basis of an X-axis (the first direction 10). However, the present embodiment is not limited thereto, and the beam 340 may only be tilted on the basis of the X-axis.

FIG. 10 is a fifth example diagram for explaining a method for manufacturing a buffer structure constituting the semiconductor package according to the first embodiment of the present disclosure.

When the polymer 330 is exposed to the beam 340 for a certain period of time, the polymer 330 may be expanded in a state in which the plurality of pores 151 are formed to form the buffer structure 150. An example of the buffer structure 150 thus formed is as shown in FIG. 3.

Next, a case where the buffer structure 150 does not include the trench area 320 and is formed outside the neck area 210 of the first conductive bump 140 will be described.

FIG. 11 is a first example diagram for explaining a method for manufacturing a buffer structure constituting a semiconductor package according to a second embodiment of the present disclosure. The following description will be referred to FIG. 11.

In the above case, the polymer 330 may be placed on the second insulating film 230. At this time, the polymer 330 may be placed at a position where it comes into contact with the first conductive bump 140. However, the present embodiment is not limited thereto. As shown in FIG. 13, the polymer 330 may also be placed at a position where it does not come into contact with the first conductive bump 140. FIG. 13 is a third example diagram for explaining a method for manufacturing the buffer structure constituting the semiconductor package according to the second embodiment of the present disclosure.

When the polymer 330 is placed on the second insulating film 230, as shown in FIGS. 12 and 14, a beam 340 of a specific wavelength band is irradiated in the direction in which the polymer 330 is located, and the polymer 330 may be expanded in which the plurality of pores 151 are formed, thereby forming the buffer structure 150. An example of the buffer structure 150 thus formed is as shown in FIG. 4.

The polymer 330 can be able to expand in a state in which the plurality of pores 151 are formed to fill up the empty space formed in the neck area 210 of the first conductive bump 140. Therefore, when the polymer 330 is placed as shown in FIG. 13, it may be exposed to beam 340 for a longer period of time than a case where the polymer 330 is placed as shown in FIG. 11. At this time, it is also possible to increase the amount of irradiated beam and shorten the time for the polymer 330 to be exposed to the beam 340. FIG. 12 is a second example diagram for explaining a method for manufacturing a buffer structure constituting a semiconductor package according to a second embodiment of the present disclosure, and FIG. 14 is a fourth example diagram for explaining the method for manufacturing the buffer structure constituting the semiconductor package according to the second embodiment of the present disclosure.

This will be described again referring to FIG. 1.

A plurality of first conductive bumps 140 may be installed in the bottom of the first re-distribution layer 120. When there are a plurality of first conductive bumps 140, the buffer structure 150 may be formed on side surfaces of all the first conductive bumps 140. However, the present embodiment is not limited thereto. The buffer structure 150 may be formed on the side surfaces of some of the first conductive bumps 140 among the plurality of first conductive bumps 140, and may not be formed on the side surfaces of some other first conductive bumps 140.

When the buffer structure 150 is formed on the side surfaces of some of the first conductive bumps 140 among the plurality of first conductive bumps 140, the buffer structure 150 may be formed on the side surface of the first conductive bump 140 located on the outside.

The semiconductor package 100 may further include an underfill layer 160 and a molding layer 170.

The underfill layer 160 is filled up between the semiconductor chip 110 and the first re-distribution layer 120 to mitigate or prevent the second conductive bump 130 from becoming defective. Although the underfill layer 160 may be formed to further protrude in a lateral direction (the first direction 10) from the side surface of the semiconductor chip 110, the technical idea of the present disclosure is not limited thereto.

The molding layer 170 is formed to protect the semiconductor chip 110 and the first re-distribution layer 120 from an external impact. Such a molding layer 170 may be formed to cover the upper part of the first re-distribution layer 120, the side part of the underfill layer 160, the side part of the semiconductor chip 110, and the like. However, the present embodiment is not limited thereto. The molding layer 170 may also be formed to cover the upper part of the first re-distribution layer 120, the side part of the underfill layer 160, the side part and the upper part of the semiconductor chip 110, and the like.

The molding layer 170 may be formed of an insulating substance as a material. The molding layer 170 may be formed to include, for example, an epoxy molding compound (EMC) or silicon hybrid substances of two types or more.

On the other hand, although not shown in FIG. 1, the buffer structure 150 may be applied to the second conductive bump 130 in a similar manner. When the underfill layer 160 is not formed to cover the second conductive bump 130 between the semiconductor chip 110 and the first re-distribution layer 120, the buffer structure 150 may be formed to cover the side surfaces of the second conductive bump 130.

The semiconductor package 100 may be provided as a circuit board manufactured using a flip chip method. This will be described below.

FIG. 15 is a cross-sectional view schematically showing the structure of a semiconductor package according to a third embodiment of the present disclosure.

According to FIG. 15, the semiconductor package 100 may be configured to include a semiconductor chip 110, a second re-distribution layer ($2^{nd}$ RDL) 410, a third insulating film 420, a second wiring 430, a third conductive bump 440, and a buffer structure 150.

Since the semiconductor chip 110 has been described above referring to FIG. 1, detailed description thereof will not be provided here.

The second re-distribution layer 410 may be formed to have the same structure as that of the first re-distribution layer 120. The second wiring 430 is formed on the top of such a second re-distribution layer 410, and may be electrically connected to a plurality of wirings provided inside the second re-distribution layer 410.

The third conductive bump 440 is for electrically connecting the semiconductor chip 110 and the second re-distribution layer 410, and may be formed to have a structure that is the same as or similar to that of the first conductive bump 140.

The buffer structure 150 is formed to cover the side surface of the first conductive bump 140, and the buffer structure 150 described referring to FIGS. 1 to 14 may be similarly applied.

The semiconductor package 100 provided with the buffer structure 150 according to various embodiments of the present disclosure has been described above referring to FIGS. 1 to 15. The buffer structure 150 may have a porous polymer structure for reducing or preventing cracks of the conductive bumps 140 and 440.

The buffer structure 150 may act as a stress buffer in an area to which much stress is applied, by patterning a polymer, which includes CFA with or without a trench in a solder resist or substrate, in a neck area having a short solder ball crack path, and irradiating a UV Laser after SBA to form a porous polymer. Because the semiconductor package 100 includes the buffer structure 150, a solder ball stress relax effect can be obtained.

The present disclosure may be applied to a BGA-series package to which a solder ball is applied, a Flip Chip product using WLP or a bump, and the like.

In concluding the detailed description, those skilled in the art will appreciate that many variations and modifications may be made to the preferred embodiments without substantially departing from the principles of the present disclosure. Therefore, the disclosed preferred embodiments of the inventive concepts are used in a generic and descriptive sense only and not for purposes of limitation.

What is claimed is:

1. A semiconductor package comprising:
   a semiconductor chip;
   a first conductive bump;
   a first re-distribution layer between the semiconductor chip and the first conductive bump and electrically connecting the semiconductor chip and the first conductive bump; and
   a buffer structure filling a space between a side surface of the first conductive bump and one surface of the first re-distribution layer,
   wherein the buffer structure includes a plurality of pores, wherein the buffer structure includes a polymer that includes a chemical foaming agent.

2. The semiconductor package of claim 1, wherein the buffer structure covers a neck area of the first conductive bump.

3. The semiconductor package of claim 1, wherein the polymer fills a groove formed in the first re-distribution layer.

4. The semiconductor package of claim 3, wherein the groove does not come into contact with a first wiring provided inside the first re-distribution layer to electrically connect the semiconductor chip and the first conductive bump.

5. The semiconductor package of claim 1, wherein the polymer is configured to expand in reaction to an irradiating beam.

6. The semiconductor package of claim 5, wherein the irradiating beam is tilted with respect to a longitudinal direction of the first re-distribution layer.

7. The semiconductor package of claim 5, wherein the polymer is formed into the buffer structure by the irradiating beam reacting with the polymer.

8. The semiconductor package of claim 5, wherein the polymer is configured to react to the irradiating beam of a UV wavelength band.

9. The semiconductor package of claim 1, further comprising:
   a second conductive bump between the semiconductor chip and the first re-distribution layer,
   wherein the buffer structure fills a space between a side surface of the second conductive bump and a second surface of the first re-distribution layer.

10. The semiconductor package of claim 1, wherein the semiconductor package is one of a package substrate or a circuit board manufactured using a flip chip method.

11. A semiconductor package comprising:
    a semiconductor chip;
    a first conductive bump;
    a first re-distribution layer between the semiconductor chip and the first conductive bump and electrically connecting the semiconductor chip and the first conductive bump; and
    a buffer structure filling a space between a side surface of the first conductive bump and one surface of the first re-distribution layer,
    wherein the buffer structure includes a plurality of pores, is a polymer including a chemical foaming agent, and is formed by irradiating a beam of a UV wavelength band in a direction in which the polymer is located.

* * * * *